(12) United States Patent
Bruno

(10) Patent No.: US 7,125,294 B2
(45) Date of Patent: Oct. 24, 2006

(54) CIRCUIT BOARD MOUNTING BRACKET

(75) Inventor: David J. Bruno, Doylestown, PA (US)

(73) Assignee: PEM Management, Inc., Wilmington, DE (US)

( * ) Notice: Subject to any disclaimer, the term of this patent is extended or adjusted under 35 U.S.C. 154(b) by 44 days.

(21) Appl. No.: 11/042,097

(22) Filed: Jan. 26, 2005

(65) Prior Publication Data

US 2005/0181646 A1  Aug. 18, 2005

Related U.S. Application Data

(60) Provisional application No. 60/544,309, filed on Feb. 17, 2004.

(51) Int. Cl.
*H01R 4/02* (2006.01)

(52) U.S. Cl. ...................................... 439/876

(58) Field of Classification Search ................ 439/101, 439/876, 83, 92, 91
See application file for complete search history.

(56) References Cited

U.S. PATENT DOCUMENTS

| | | | |
|---|---|---|---|
| 2,040,374 A | 5/1936 | Grimes | |
| 2,649,126 A | 8/1953 | Tinnerman | |
| 2,974,703 A | 3/1961 | Rapata | |
| 3,084,211 A | 4/1963 | Rapata | |
| 3,106,994 A | 10/1963 | Scott | |
| 3,110,338 A | 11/1963 | Rapata | |
| 3,155,771 A | 11/1964 | Steger et al. | |
| 3,210,720 A * | 10/1965 | Harris, Jr. ................... | 439/518 |
| 3,425,725 A | 2/1969 | Givot et al. | |
| 3,443,617 A | 5/1969 | Whiteside et al. | |
| 3,527,280 A | 9/1970 | MacNorius | |
| 3,816,011 A | 6/1974 | Biebuyck et al. | |
| 4,358,234 A | 11/1982 | Takegawa et al. | |
| 4,627,760 A | 12/1986 | Yagi et al. | |
| 4,749,357 A * | 6/1988 | Foley ........................ | 439/80 |
| 4,753,561 A | 6/1988 | Betterton et al. | |
| 4,878,856 A | 11/1989 | Maxwell | |
| 4,921,431 A | 5/1990 | Garay et al. | |
| 5,044,984 A | 9/1991 | Mosser et al. | |
| 5,062,811 A * | 11/1991 | Hackman ................... | 439/620 |
| 5,090,912 A | 2/1992 | Zell | |
| 5,112,249 A * | 5/1992 | Henry et al. ................ | 439/581 |
| 5,122,064 A | 6/1992 | Zarreii | |
| 5,452,978 A | 9/1995 | Winton, III | |
| 5,735,696 A | 4/1998 | Niitsu et al. | |
| 5,810,501 A | 9/1998 | Ross | |
| 6,077,093 A | 6/2000 | Seong et al. | |
| 6,322,392 B1 | 11/2001 | Wang | |

(Continued)

*Primary Examiner*—Phuong Dinh
(74) *Attorney, Agent, or Firm*—Gregory J. Gore

(57) ABSTRACT

A pick-and-place type circuit board mounting bracket is surface-mounted, or alternatively, soldered with reinforcing posts that occupy one or more through-holes in the circuit board. The mounting face of the bracket is offset with respect to its mounting base to allow the face of the bracket to be sub-flush, flush, or extend beyond the edge of the circuit board. The front surface of the bracket is preferably perpendicular to the bottom surface and a longitudinal threaded bore extends through the main body to provide attachment means for affixing structures to the bracket. The posts which extend downwardly through the circuit board may have at least one planar side surface or a single rectangular post may be employed. The length of the posts is preferably less than the thickness of the circuit board for surface mount applications or long enough to extend through the circuit board for wave soldering.

18 Claims, 2 Drawing Sheets

U.S. PATENT DOCUMENTS 6,338,653 B1    1/2002   Jones et al.
6,643,143 B1    11/2003  Stewart et al.

* cited by examiner

CIRCUIT BOARD MOUNTING BRACKET

RELATED APPLICATIONS

The present application is related to provisional patent application Ser. No. 60/544,309 entitled "Circuit Board Mounting Bracket" filed on Feb. 17, 2004, priority from which is hereby claimed.

FIELD OF THE INVENTION

The present invention relates to fasteners and types of hardware for circuit boards. More specifically, it relates to a right-angle mounting bracket for a circuit board which can be surface-mounted by soldering.

BACKGROUND OF THE INVENTION AND PRIOR ART

There are many mounting brackets that provide mounting attachment at a right angle from a surface. A particular bracket is disclosed, for example, in U.S. Pat. No. 5,810,501 entitled "Perpendicular Edge Fastener." The device in this patent includes a rectangular base which provides clinch-type attachment of the bracket to a metal sheet. There is, however, a great demand for mounting brackets for circuit boards, but this device is not suitable for circuit board applications. Heretofore none has been devised which may be most efficiently used as a versatile right-angle circuit board surface mount bracket. One requirement for a circuit board bracket is its ability to provide a vertical attachment face which is flush with or extends beyond the edge of the circuit board, however this desired mounting position poses several problems. First, to be efficiently used in high volume circuit board production, the mounting bracket is often required to be transported to the circuit board by automated pick-and-place equipment. Such equipment requires a centered, flat top surface so that the device can be handled by the vacuum placement arm. Secondly, the mounting bracket needs to have a planar attachment face to establish an orientation plane perpendicular to the surface of the circuit board. Finally, the circuit board bottom surface of the bracket cannot be co-extensive with the attachment face because when flush edge mounting is required, or a mounting arrangement in which the attachment face is required to extend beyond the edge of the circuit board, there is not a circuit board perimeter along the front edge of the bracket to permit the proper inspection of the surface mount solder joint. Unfortunately, no device presently exists which provides a circuit board mounting bracket with features which solve these problems.

Pertinent patent prior art of which the applicant is aware includes U.S. Pat. No. 6,643,143 issued to Stewart et al.; U.S. Pat. No. 4,878,856 issued to Maxwell; U.S. Pat. No. 5,044,984 issued to Mosser et al.; U.S. Pat. No. 5,122,064 issued to Zarreii; U.S. Pat. No. 5,090,912 issued to Zell; U.S. Pat. No. 4,921,431 issued to Garay et al.; U.S. Pat. No. 5,735,696 issued to Niitsu et al.; U.S. Pat. No. 6,077,093 issued to Seong et al.; U.S. Pat. No. 6,322,392 issued to Wang; and U.S. Pat. No. 6,338,653 issued to Jones et al. These patents all describe circuit board mounting hardware but none fulfills the need in the art described above.

SUMMARY OF THE INVENTION

The present device provides a pick-and-place type of circuit board mounting bracket which can be surface-mounted, or alternatively, soldered with reinforcing posts that occupy one or more through-holes in the circuit board. The mounting face of the bracket is offset with regard to a mounting pad to allow the face of the bracket to be sub-flush, flush, or extend beyond the edge of the circuit board.

More specifically, the applicant has devised a bracket for attachment to a circuit board which comprises a main body having a planar front surface, the front surface further including a bottom edge and a centered planar top surface of the main body adapted for pick-and-place transportation. A base lies beneath the bottom edge of the front surface and has a front side parallel to the front surface and offset rearwardly therefrom, the base further including a planar bottom surface. The front surface is preferably perpendicular to the bottom surface and a longitudinal threaded bore extends through the main body to provide attachment means to the bracket. One or more posts may optionally extend downwardly from the bottom surface and the post or posts are received in apertures which are drilled or milled into the circuit board. The post or posts may have at least one planar side surface or a single rectangular post may be employed. The length of the posts is preferably less than the thickness of the circuit board for surface mount applications or long enough to extend through the circuit board for wave soldering applications. The front side of the base may be offset rearwardly from the plane of the front surface so that when objects are attached to the bracket in flush alignment with the side edge of the circuit board, the bottom surface of the base will lie entirely within a top surface of the circuit board. In one embodiment the front surface is coplanar with a side edge of the circuit board and a solder joint rigidly affixes the bottom surface of the base to the circuit board.

While the present invention will be described with the reference to a specific embodiment, the following descriptive is illustrative of the invention and is not to be construed as limiting the invention. Various modifications to the present invention can be made to the preferred embodiment by those skilled in the art without departing from the true spirit and scope of the invention. It will be noted here that for better understanding like components are designated by the reference numerals throughout the various figures of drawing which follow.

DESCRIPTION OF THE PREFERRED EMBODIMENT

Figure 1:
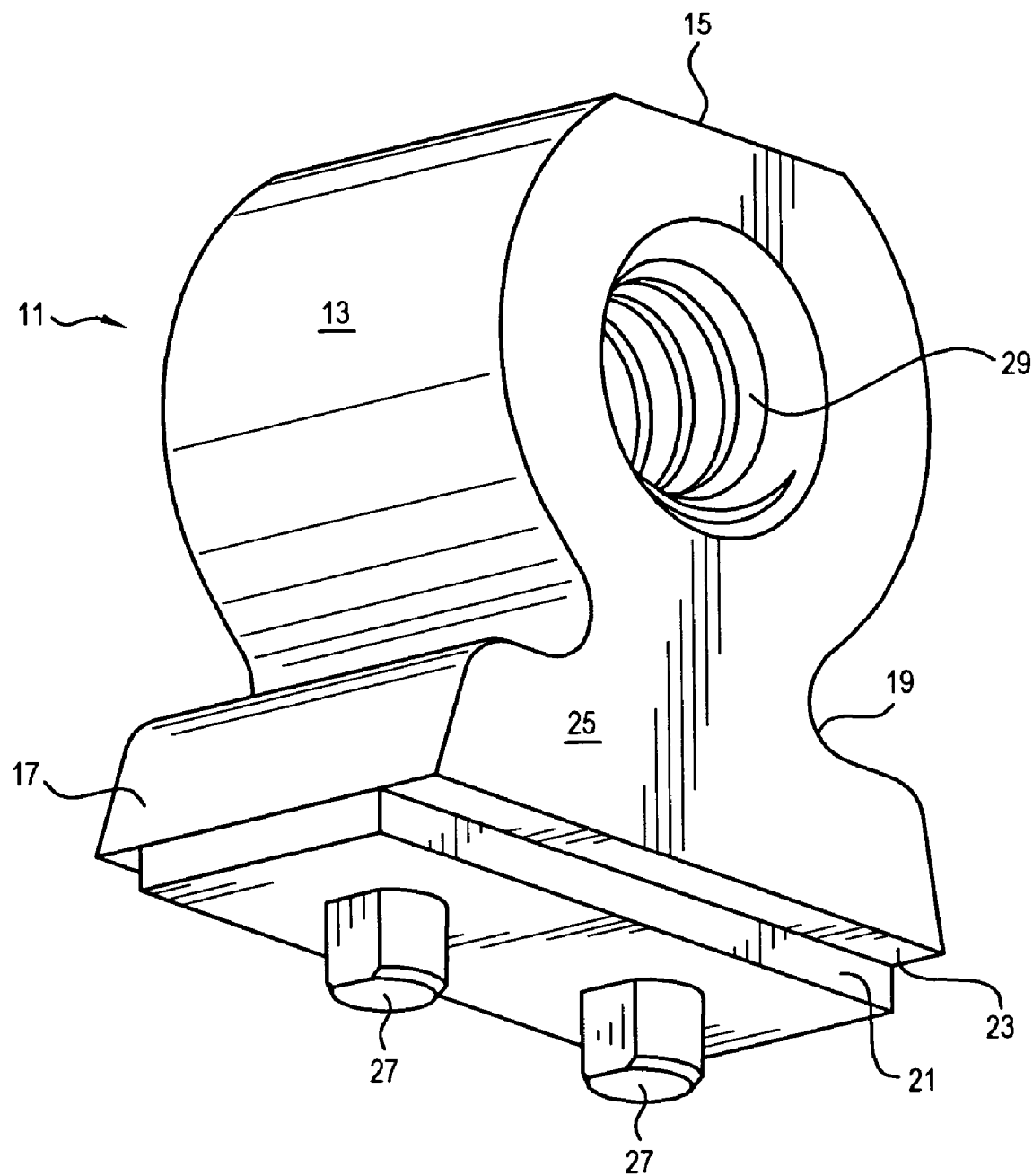
FIG. 1 is a front left bottom isometric view of the invention.

Referring now to FIG. 1, the present invention comprises a circuit board mounting bracket for the attachment of other hardware such as panels, circuit boards, or other types of hardware and circuit board components. The bracket 11 is a unitary element which includes a partially cylindrical main body 13 having a flat top surface 15. The body portion 13 is connected to a laterally-extended base 17 by a neck portion 19 of reduced dimension. This configuration is shown to be not only structurally strong but also permits the volume of the bracket material to be reduced so that it is extremely efficient for casting. This bracket can be made out of any powdered metal and then plated for solderability. It could also be molded from zinc, aluminum, or other material and plated for solderability.

Extending downwardly from the base 17 is a mounting pad 21 and a step 23 which offsets the mounting pad 21 from a mounting face 25 of the bracket 11. The mounting pad 21 preferably includes two or more mounting posts 27 which extend downwardly from the bottom surface of the pad 21. The mounting pad 21 could include one rectangular post and a correspondingly shaped hole in the circuit board for positive alignment with the circuit board. The posts could be removed and the surface tension between the molten solder, the mounting pad 21, and the rectangular solder pad on the circuit board will provide alignment during the soldering operation. The body portion 13 includes a threaded bore 29 which serves as a releasable attachment means for articles mounted to the bracket which will abut and be supported by the planar mounting face 25.

Figure 2A:
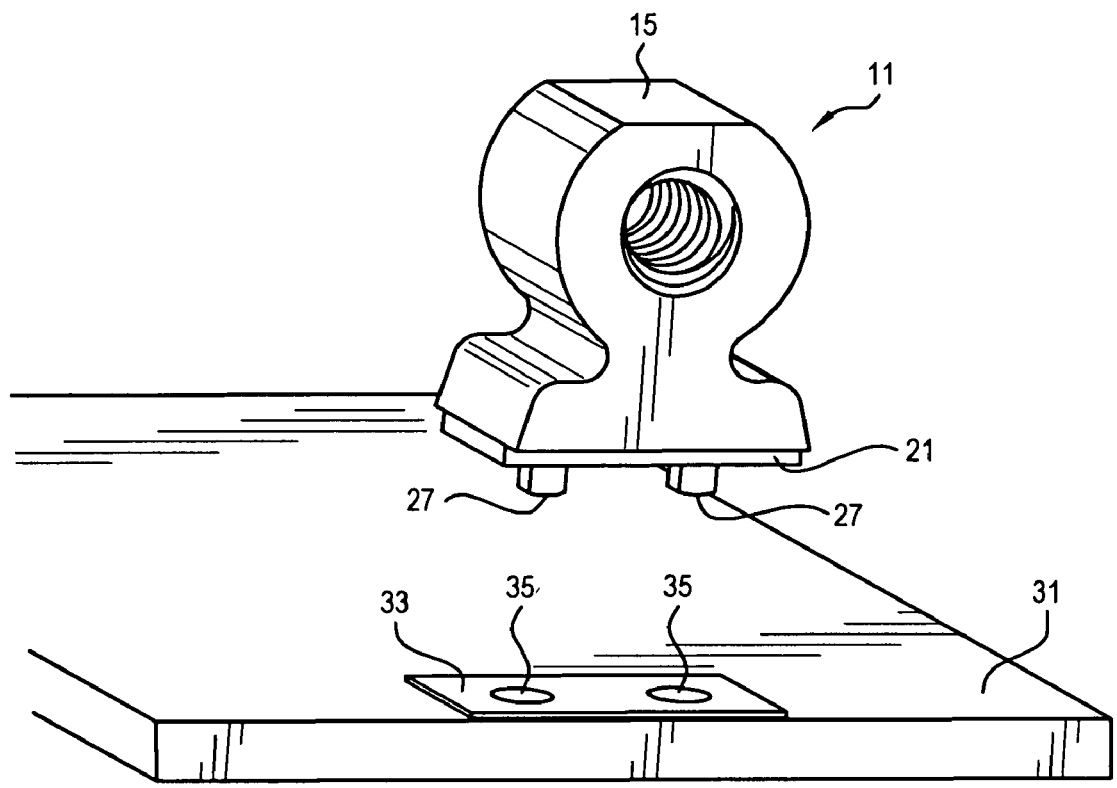
FIGS. 2A and 2B are sequential assembly drawings showing the mounting of the bracket invention to a circuit board.
Figure 2B:
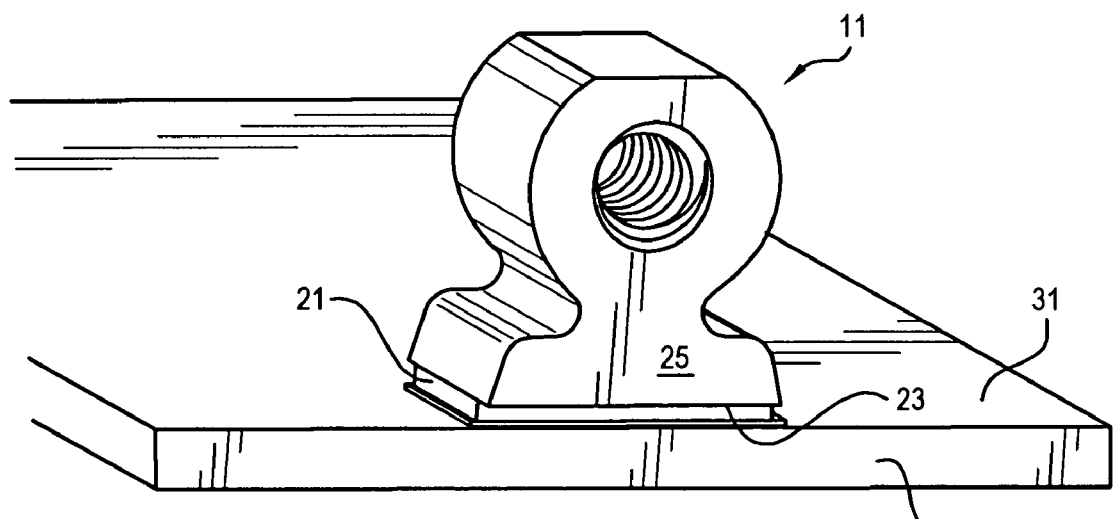

Referring now to FIGS. 2A and 2B, an assembly sequence is depicted. The fastener shown in FIG. 2A is shown in alignment with its mounting position but removed from circuit board 31 onto which it is installed. To aid in the attachment of the bracket to the circuit board, the circuit board includes a solder coat 33 with substantially the same dimensions as the attachment pad footprint and also a corresponding number of mounting holes 35 for receiving the bracket posts 27 which extend downwardly from the bracket mounting pad 21. One or more posts may be used and the posts may have at least one planar side surface to achieve circuit board orientation. A single rectangular post may be used to be received in a compatible hole in the circuit board. The solder on the circuit board may also extend into the mounting holes for added strength of attachment. As shown more clearly in FIGS. 2A and 2B, the top of the bracket 11 includes a centered flat planar surface 15 suitable for use in conjunction with pick-and-place type assembly robotics.

Referring now to FIG. 2B, the bracket is shown positioned on the circuit board in its final mounted position with the posts extending through the circuit board holes. In this depiction, the mounting pad 21 is in approximate alignment with the edge of the circuit board 31. This position, in combination with the offset distance provided by step 23 between the mounting face of the bracket and the edge of the mounting pad, permits the bracket mounting face 25 to extend beyond the edge of the circuit board 43. This may be desirable in many applications where the panel or other member is to be held a spaced distance from the edge of the circuit board. The bracket face may be mounted anywhere between subflush, flush, or extended beyond the edge of the circuit board. The step 23 around the mounting pad 21 of the bracket also permits solder joint inspection with the bracket edge-mounted as shown in FIGS. 2A and 2B.

It should be understood that there may be other modifications and changes to the present invention that will be obvious to those of skill in the art from the foregoing description, however, the present invention should be limited only by the following claims and their legal equivalents.

What is claimed is:

1. A bracket for attachment to a circuit board, comprising:
   a main body having a planar front surface including a bottom edge;
   attachment means on said main body for affixation of a device to said front surface;
   a centered planar top surface of said main body adapted for pick-and-place transportation of the bracket; and
   a base of said main body beneath the bottom edge of said front surface, said base having a front side parallel to said front surface and offset rearwardly therefrom, said base further including a planar bottom surface adapted for soldering to a top surface of a circuit board.

2. The bracket of claim 1 wherein said base further includes at least one post extending downwardly from said bottom surface.

3. The bracket of claim 2 further including a longitudinal threaded bore extending through said front surface.

4. The bracket of claim 2 which includes only two posts.

5. An assembly of parts including the bracket of claim 2 and a circuit board having an aperture receiving each post of said bracket.

6. The circuit board and bracket assembly of claim 5 wherein the front surface is co-planar with a side edge of said circuit board.

7. The circuit board and bracket assembly of claim 5 further including a solder joint between said base and the top surface of the circuit board which rigidly affixes said bracket to said circuit board.

8. The circuit board and bracket assembly of claim 7 wherein the length of said posts is less than the thickness of the circuit board.

9. The bracket of claim 2 wherein said posts are unitary with the main body.

10. The bracket of claim 1 wherein the front surface is perpendicular to the bottom surface.

11. The bracket of claim 1 further including a single post with at least one planar side surface, said post extending downwardly from said bottom surface.

12. An assembly of parts including the bracket of claim 1 and a circuit board including a solder joint between said bottom surface of the base and a top surface of the circuit board.

13. The circuit board and bracket assembly of claim 5 wherein the front surface extends beyond a side edge of the circuit board and wherein the bottom surface does not cover a portion of a top surface of the circuit board in front of the base.

14. The bracket of claim 1 wherein said main body, said attachment means, said top surface, and said base are all portions of a unitary device composed entirely of metal.

15. The bracket of claim 14 further described in that said entire bottom surface is metal plated.

16. The bracket of claim 14 being molded from one of the group of metals consisting of zinc and aluminum.

17. The bracket of claim 14 being a casting of powdered metal plated for solderability.

18. A bracket for attachment to a circuit board, comprising:
   a main body having a planar front surface including a bottom edge;
   attachment means on said main body for affixation of a device to said front surface; and
   a base of said main body beneath the bottom edge of said front surface, said base having a front side parallel to said front surface and offset rearwardly therefrom, said base further including a planar bottom surface adapted for soldering to a top surface of a circuit board.

* * * * *